United States Patent
Pyapali et al.

(10) Patent No.: US 6,779,131 B2
(45) Date of Patent: Aug. 17, 2004

(54) RECONFIGURABLE MULTI-CHIP MODULES

(75) Inventors: Rambabu Pyapali, Santa Clara, CA (US); Xuejun Yuan, Sunnyvale, CA (US); Xiaowei Jin, Mountain View, CA (US); Peter Lai, San Jose, CA (US); Samer H. Haddad, Fremont, CA (US); Jeffrey Wong, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 244 days.

(21) Appl. No.: 09/846,943

(22) Filed: May 1, 2001

(65) Prior Publication Data

US 2002/0194447 A1 Dec. 19, 2002

(51) Int. Cl.[7] ................................................. G06F 11/00
(52) U.S. Cl. ......................................................... 714/8
(58) Field of Search ..................................... 714/8, 710

(56) References Cited

U.S. PATENT DOCUMENTS

| | | | | |
|---|---|---|---|---|
| 5,892,896 A | * | 4/1999 | Shingo | 714/8 |
| 6,060,339 A | * | 5/2000 | Akram et al. | 438/108 |
| 6,081,463 A | * | 6/2000 | Shaffer et al. | 365/200 |
| 6,154,851 A | * | 11/2000 | Sher et al. | 714/5 |
| 6,204,562 B1 | * | 3/2001 | Ho et al. | 257/777 |
| 6,363,502 B1 | * | 3/2002 | Jeddeloh | 714/52 |
| 6,405,324 B2 | * | 6/2002 | Shore | 714/8 |
| 6,483,755 B2 | * | 11/2002 | Leung et al. | 365/189.05 |
| 6,530,005 B2 | * | 3/2003 | Koschella et al. | 711/165 |

* cited by examiner

*Primary Examiner*—Scott Baderman
*Assistant Examiner*—Bryce P. Bonzo
(74) *Attorney, Agent, or Firm*—Rosenthal & Osha L.L.P.

(57) ABSTRACT

The present invention relates to a method and apparatus for a reconfigurable multi-chip module. The reconfigurable multi-chip module includes a processor; a memory module connected to the processor; and a memory control component for controlling whether the processor uses the memory module. The method of producing multi-chip modules includes assembling a processor and a memory module on the multi-chip module; testing the memory module; and selectively configuring the processor to use the memory module based on the testing of the memory module.

17 Claims, 3 Drawing Sheets

RECONFIGURABLE MULTI-CHIP MODULES

BACKGROUND OF INVENTION

Generally, a microprocessor operates much faster than main memory can supply data to the microprocessor. Therefore, many computer systems temporarily store recently and frequently used data in smaller, but much faster cache memory. Cache memory may reside directly on the microprocessor chip (Level 1 cache) or may be external to the microprocessor (Level 2 cache). In the past, on-chip cache memory was relatively small, 8 or 16 kilobytes (KB); however, more recent microprocessor designs have on-chip cache memories of 256 and even 512 KB.

Referring to FIG. 1, a typical computer system includes a microprocessor (10) having, among other things, a CPU (12), a load/store unit (14), and an on-board cache memory (16). The microprocessor (10) is connected to a main memory (18) that holds data and program instructions to be executed by the microprocessor (10). Internally, the execution of program instructions is carried out by the CPU (12). Data needed by the CPU (12) to carry out an instruction are fetched by the load/store unit 14. Upon command from the CPU (12), the load/store unit (14) searches for the data first in the cache memory (16), then in the main memory (18).

As will be readily apparent to those skilled in the art, as the size of on-chip cache memory increases, the amount of data kept closely to the microprocessor for faster processing increases. Unfortunately, it is also a reality in microprocessor manufacturing that as on-chip cache memory size increases, the potential for producing memory with faulty regions increases. Techniques have been used in the industry to attempt to combat the loss of manufacturing yield due to these unusable sections of memory. For example, if the faulty memory region lies with one or more columns of the memory array, other columns may be mapped to "cover" the unusable columns.

Typically, a Multi-Chip Module (MCM) includes one or more processors and one or more SRAMS. Testing of the MCM is done at various stages of the manufacturing process. There are yield issues at various levels in an MCM. Dies are tested at the wafer level and, if found good, are assembled on the MCM. Testing at wafer level is well known in the art and has been used for many years now. Alternatively, dies for an MCM could come from different fabs, i.e., manufacturing plants that make semiconductor devices. Limited testing of the dies does occur at the fabs. Testing is done after all the dies are assembled and packaged.

One well known way of testing Static Random Access Devices (SRAM) in an MCM module is the RAMTEST function. The RAMTEST function works by selecting a SRAM connected to the processor, writing a bit pattern to a specific address in the selected SRAM, and reading from the specific address in the selected SRAM. Upon reading the data from the specific address in the selected SRAM, faulty rows and columns in the SRAM can be identified. One well known algorithm for performing the RAMTEST function is included below.

```
I
For (addr=0; addr < N; addr++) // Ascending order
Write (v); // memory initialization
```

```
II
For (addr=0; addr < N; addr++)
{
Read(v);
Write(vbar);
Read(vbar);
} // vbar is negate of v
III
For (addr=N.1; addr>=0; addr..) // Descending order
{
Write(v);
Read(v);
}
```

Notes: Checker board data pattern can be used

The SRAM faults detected by the above algorithm are stored in a special RAMTEST fault register (FREG), which has 8 bits. Those skilled in the art will appreciate that the dies may go through a limited testing at wafer sort, i.e., prior to assembly.

SUMMARY OF INVENTION

In general, in one aspect, the present invention involves a reconfigurable multi-chip module comprising a processor; a memory module connected to the processor; and a memory control component for controlling whether the processor uses the memory module.

In general, in one aspect, the present invention involves a method of producing multi-chip modules comprising assembling a processor and a memory module on the multi-chip module; testing the memory module; and selectively configuring the processor to use the memory module based on the testing of the memory module.

In general, in one aspect, the present invention involves a reconfigurable multi-chip module comprising processing means; memory means connected to the processing means; and control means for determining whether the processing means uses the memory means.

In general, in one aspect, the present invention involves a reconfigurable multi-chip module comprising a processor comprising a memory control component; a first memory module connected to the processor; and a second memory module connected to the processor, wherein the memory control component determines whether the processor uses the first memory module and the second memory module.

Other aspects and advantages of the invention will be apparent from the following description and the appended claims.

DETAILED DESCRIPTION

Figure 1:
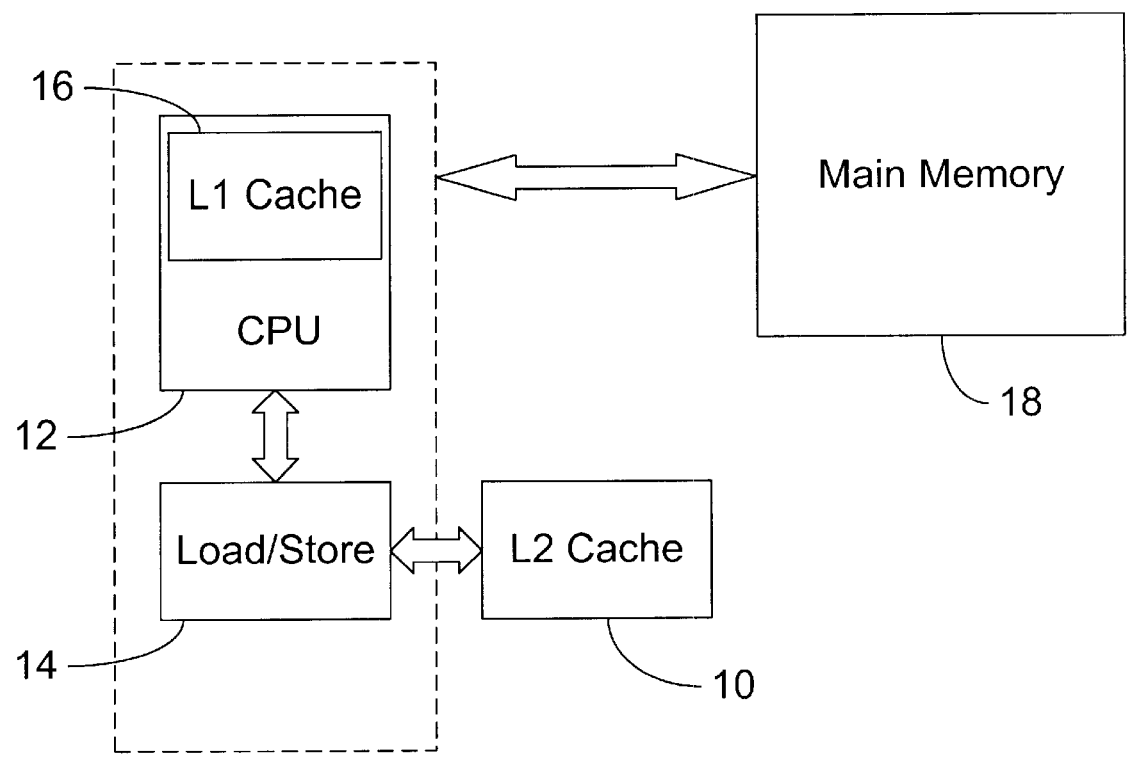
FIG. 1 shows a typical prior art computer system.

Generally, in one or more embodiments, the present invention involves a method and apparatus of reconfiguring dies on a Multi-Chip Module (MCM) after the assembly of the dies on the MCM substrate to improve useful MCM yield. Specific exemplary embodiments are described below with reference to the accompanying figures. Like elements are denoted by like reference numerals throughout the figures.

Figure 2:
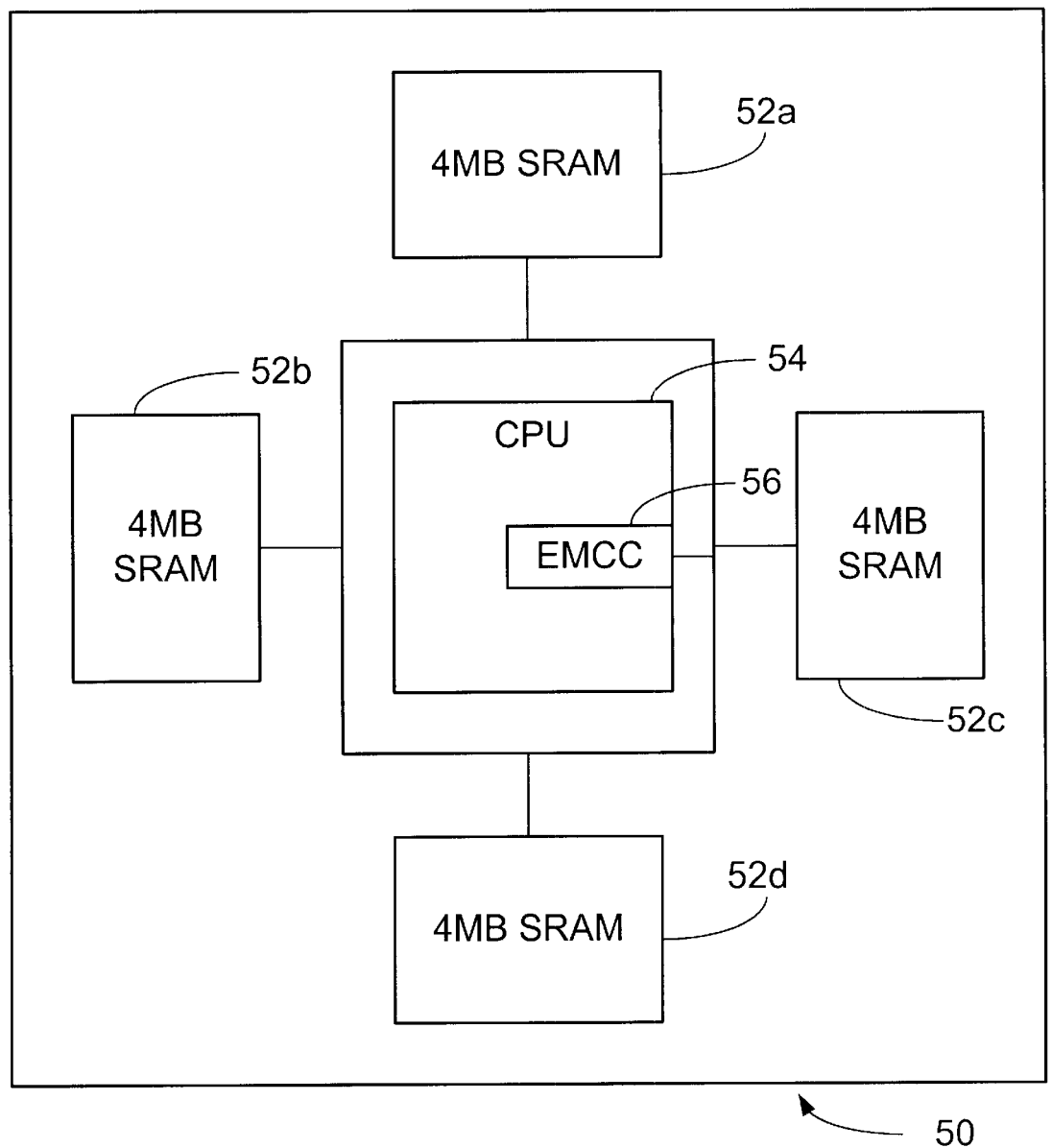
FIG. 2 shows a block diagram of an exemplary MCM in accordance with an embodiment of the invention.

Referring to FIG. 2, a 16 megabyte (MB) MCM (50) is shown. The MCM (50) has four memory modules connected to processor (54). For instance, each memory module may be a 4 MB static random access memory (SRAM) die (52a . . . 52d). The processor (54) includes a memory control component (56). The memory control component (56) manages access to external memory modules. Thus, whether each of the shown SRAM dies (52a . . . 52d) is in operable communication with processor (54) depends on memory control component (56).

Upon assembly of the MCM (50), the four SRAM dies (52a . . . 52d) are tested and the results are analyzed. If one or more of the SRAM dies (52a . . . 52d) are faulty, the memory control component is configured to only use the properly functioning SRAM dies. Thus, the MCM (50) can perform the originally intended functions, albeit with reduced resources.

Figure 3:
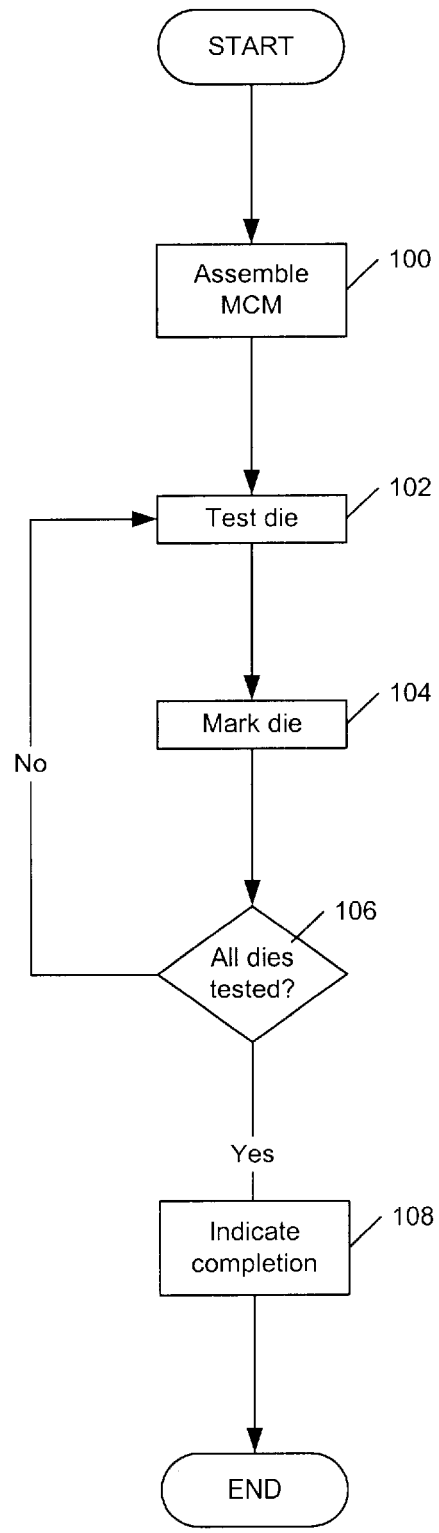
FIG. 3 shows a flow chart of an exemplary production process in accordance with an embodiment of the invention.

Referring to FIG. 3, a flow chart showing the MCM production process is shown. First, dies (52a . . . 52d) and processor (54) are assembled and packaged (step 100) on the MCM (50). Next, the dies (52a . . . 52d) are tested for fault (step 102). For example, standard RAM test vectors may be administered to the SRAM dies in a sequence by the processor (54). If any SRAM die is found faulty, that the memory control component (56) marks that die as faulty (step 104) and the die will not be used by the processor (54).

In one embodiment, the memory control component may use a special RAMTEST fault register (FREG) in which dies are marked as valid or invalid. In such a case, once the testing of all the SRAM dies is complete, the processor looks at the RAMTEST fault register (FREG) to determine which of the dies are functional. Depending on the results in the register, the processor then configures the available external memory size and which dies are accessed in normal operation. For four SRAMS, the SRAM faults may be stored in 4 bits of the 8 bit RAMTEST fault register (FREG) and correspond in the following way.

FREG[0]=SRAM0

FREG[1]=SRAM1

FREG[2]=SRAM2

FREG[3]=SRAM3

Initially, all of the bits in the FREG are initialized to a value of 1, which indicates that they are valid. The RAMTEST function is then performed. The RAMTEST function is started by setting an external RAMTEST pin to high, which puts the processor into RAMTEST mode. When the processor enters RAMTEST mode, the first SRAM is selected by setting addr(23) addr(22)=00. Then, the RAMTEST algorithm is run to detect memory faults. If one or more faults are found in the SRAM, that SRAM is marked as invalid in the special RAMTEST fault register. Setting bit0=0 indicates that the SRAM is invalid. This process repeats for the other three SRAMs, which begin with the setting of addr(23) addr(22)=01, 10, and 11 respectively. The bits in the FREG register are updated after each SRAM is tested.

After testing is complete, the processor is placed in reconfiguration mode by the memory control module. In reconfiguration mode, the processor reconfigures into one of the 5 configurations listed below depending on the contents of the FREG.

If FREG[3 . . . 0] = "1111" => CPU with 16 Mbytes of E$
If FREG[3 . . . 0] = "1110" => CPU with 12 Mbytes of E$
If FREG[3 . . . 0] = "1101" => CPU with 12 Mbytes of E$
If FREG[3 . . . 0] = "1011" => CPU with 12 Mbytes of E$
If FREG[3 . . . 0] = "0111" => CPU with 12 Mbytes of E$
If FREG[3 . . . 0] = "1100" => CPU with 8 Mbytes of E$
If FREG[3 . . . 0] = "1001" => CPU with 8 Mbytes of E$
If FREG[3 . . . 0] = "0011" => CPU with 8 Mbytes of E$
If FREG[3 . . . 0] = "0110" => CPU with 8 Mbytes of E$
If FREG[3 . . . 0] = "1010" => CPU with 8 Mbytes of E$
If FREG[3 . . . 0] = "0101" => CPU with 8 Mbytes of E$
If FREG[3 . . . 0] = "0100" => CPU with 4 Mbytes of E$
If FREG[3 . . . 0] = "1000" => CPU with 4 Mbytes of E$
If FREG[3 . . . 0] = "0001" => CPU with 4 Mbytes of E$
If FREG[3 . . . 0] = "0010" => CPU with 4 Mbytes of E$
If FREG[3 . . . 0] = "0000" => CPU with no E$ This process repeats (step 106) for every die connected to the processor (52). Once all dies have been tested (step 106), the information may be permanently written through the use of electrical fuses. In such a case, four electrical fuses, EFUSE[3 . . . 0] are programmed with the FREG[3 . . . 0] values. Thereafter, upon initialization, the processor retrieves configuration information values from these electrical fuses. Alternatively, the values may simply be retrieved from the FREG[3 . . . 0] and, possibly, recalculated, at a subsequent initialization, a specified interval, or occurrence of a specified event. Once the reconfiguration is complete, the processor toggles a SRAMTEST_COMPLETE pin (step 108) to signal this completion and the process ends.

In the above manner, every MCM produced is useful, but may have more or less resources available. Further, even in the extreme case where all the external memory dies are found to be faulty, the MCM can be configured as a processor without any external memory.

Advantages of the present invention include one or more of the following. Useful MCM yield is increased. By using reconfigurable MCMs, an MCM is still useful even if one or more of the external memory modules are faulty. Good dies are not wasted if assembled together with faulty dies. These reconfigurable MCMs promote a cost savings constant through production of a useful MCM. The number of faulty modules on a given MCM only determine how much external memory is available to the processor.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A reconfigurable multi-chip module comprising:

a processor disposed on the multi-chip module;

a plurality of memory modules disposed on the multi-chip module and connected to the processor; and wherein the processor comprises a memory control component wherein, when in a reconfiguration mode, the processor is arranged to test the plurality of memory modules, wherein a specification of the multi-chip module is determined based on the tests of each of the plurality of memory modules, and wherein the multi-chip module is a single electronic package.

2. The reconfigurable multi-chip module of claim 1, wherein at least one of the plurality of memory modules is a random access memory.

3. The reconfigurable multi-chip module of claim 1, wherein the memory control component is a part of the processor and uses a register within the processor.

4. The reconfigurable multi-chip module of claim 1, further comprising:
    an electrical fuse for permanently storing whether the processor uses at least one of the plurality of memory modules.

5. A method of producing multi-chip modules comprising:
    assembling a processor and a plurality of memory modules on the multi-chip module;
    in a reconfiguration mode, testing the plurality of memory modules;
    selectively configuring the processor to use the plurality of memory modules based on the testing of the plurality of memory modules; and
    determining a specification of the processor dependent on the testing,
    wherein the multi-chip module is a single electronic package.

6. The method of claim 5, further comprising: marking a results of the testing,
    wherein the selective configuration of the processor to use the plurality of memory modules is based on the memory module marks.

7. The method of claim 6, wherein the results of the memory module testing is marked in a register within the processor.

8. The method of claim 5, wherein at least one the plurality of memory modules is a static random access memory.

9. The method of claim 5, further comprising:
    permanently storing whether the processor uses at least one of the plurality of memory modules with an electrical fuse.

10. A reconfigurable multi-chip module comprising:
    processing means disposed on the multi-chip module;
    a plurality of memory means disposed on the multi-chip module and connected to the processing means; and
    wherein the processing means comprises a memory control means,
    wherein, when in a reconfiguration mode, the processing means is arranged to test the plurality of memory means,
    wherein a specification of the multi-chip module is determined based on the tests of the plurality of memory modules, and
    wherein the multi-chip module is a single electronic package.

11. The reconfigurable multi-chip module of claim 10, wherein at least one of the plurality of memory modules is a random access memory.

12. The reconfigurable multi-chip module of claim 10, further comprising:
    means for permanently storing whether the processor uses at least one of the plurality of memory modules.

13. A reconfigurable multi-chip module comprising:
    a processor disposed on the multi-chip module and comprising a memory control component;
    a first memory module disposed on the multi-chip module and connected to the processor; and
    a second memory module disposed on the multi-chip module and connected to the processor,
    wherein, in a reconfiguration mode, the processor is arranged to test the first memory module and the second memory module,
    wherein a specification of the multi-chip module is determined based on the tests of the first memory module and the second memory module, and
    wherein the multi-chip module is a single electronic package.

14. The reconfigurable multi-chip module of claim 13, wherein the memory control component is a part of the processor and uses a test register within the processor.

15. The reconfigurable multi-chip module of claim 14, wherein the processor tests the first memory module and the second memory module and marks a value of whether the first memory module and the second memory module are functional in the test register.

16. The reconfigurable multi-chip module of claim 13, wherein at least one of the first memory module and the second memory module is a random access memory.

17. The reconfigurable multi-chip module of claim 13, further comprising:
    an electrical fuse for permanently storing whether the processor uses at least one of the first memory module and the second memory module.

* * * * *